(12) United States Patent
Huang et al.

(10) Patent No.: US 9,379,322 B2
(45) Date of Patent: Jun. 28, 2016

(54) HIGHLY RELIABLE NONVOLATILE MEMORY AND MANUFACTURING METHOD THEREOF

(71) Applicant: Peking University, Beijing (CN)

(72) Inventors: Ru Huang, Beijing (CN); Muxi Yu, Beijing (CN); Yimao Cai, Beijing (CN); Wenliang Bai, Beijing (CN); Yinglong Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/759,624

(22) PCT Filed: Sep. 30, 2013

(86) PCT No.: PCT/CN2013/084761
§ 371 (c)(1),
(2) Date: Jul. 7, 2015

(87) PCT Pub. No.: WO2014/121618
PCT Pub. Date: Aug. 14, 2014

(65) Prior Publication Data
US 2015/0349253 A1   Dec. 3, 2015

(30) Foreign Application Priority Data

Feb. 7, 2013  (CN) .......................... 2013 1 0049320

(51) Int. Cl.
*H01L 27/115*   (2006.01)
*H01L 45/00*   (2006.01)
(Continued)

(52) U.S. Cl.
CPC .......... *H01L 45/146* (2013.01); *G11C 13/0007* (2013.01); *H01L 45/08* (2013.01); *H01L 45/085* (2013.01); *H01L 45/122* (2013.01);
(Continued)

(58) Field of Classification Search
CPC .................................................. H01L 27/1112
USPC ........................... 438/379, 516, 537; 257/210
See application file for complete search history.

(56) References Cited

U.S. PATENT DOCUMENTS

| 8,362,454 B2 | 1/2013 | Lee et al. | |
|---|---|---|---|
| 2008/0116440 A1* | 5/2008 | Ho | H01L 45/04 257/4 |

(Continued)

FOREIGN PATENT DOCUMENTS

| CN | 101587937 A | 11/2009 |
|---|---|---|
| CN | 101681913 A | 3/2010 |

(Continued)

*Primary Examiner* — George Fourson, III
(74) *Attorney, Agent, or Firm* — Bret E. Field; Rudy J. Ng; Bozicevic, Field & Francis LLP

(57) ABSTRACT

The present invention relates to a highly reliable nonvolatile memory and a manufacturing method thereof. The nonvolatile memory comprises top electrodes, bottom electrodes and a resistive material layer disposed therebetween, wherein the top electrodes are positioned on top in the memory; the bottom electrodes are positioned on a substrate; metal oxide for forming the resistive material layer is doped with metal; and a metal oxygen storage layer is further disposed between the top electrodes and the resistive material layer. The manufacturing method adopts a method in which a doping method and a double-layer forming method are combined, so that the highly reliable and highly uniform resistive random access memory can be fabricated and accordingly the performance of the memory can be increased.

14 Claims, 3 Drawing Sheets

(51) Int. Cl.
   *G11C 13/00*   (2006.01)
   *H01L 27/11*   (2006.01)
(52) U.S. Cl.
   CPC ........ *H01L45/1233* (2013.01); *H01L 45/1253* (2013.01); *H01L 45/1266* (2013.01); *H01L 45/1273* (2013.01); *H01L 45/1625* (2013.01); *H01L 45/1666* (2013.01); *G11C 2213/56* (2013.01); *H01L 27/1112* (2013.01)

(56) References Cited

U.S. PATENT DOCUMENTS

| | | | |
|---|---|---|---|
| 2010/0078615 A1 | 4/2010 | Ito | |
| 2011/0095259 A1* | 4/2011 | Lee | H01L 45/08 257/4 |
| 2012/0176831 A1* | 7/2012 | Xiao | G11C 13/0007 365/148 |
| 2013/0121060 A1* | 5/2013 | Lee | G11C 11/5685 365/148 |
| 2013/0300509 A1* | 11/2013 | Kim | H03L 7/00 331/34 |
| 2014/0078808 A1* | 3/2014 | Hashim | G11C 13/0007 365/148 |
| 2014/0124725 A1* | 5/2014 | Chi | H01L 45/08 257/4 |
| 2015/0179937 A1* | 6/2015 | Hsueh | H01L 45/1616 438/382 |
| 2015/0187841 A1* | 7/2015 | Wang | H01L 27/2463 257/2 |
| 2015/0311257 A1* | 10/2015 | Nardi | H01L 27/2463 257/4 |

FOREIGN PATENT DOCUMENTS

| | | |
|---|---|---|
| CN | 101711431 A | 5/2010 |
| CN | 102157688 A | 8/2011 |
| CN | 102347440 A | 2/2012 |
| CN | 102365746 A | 2/2012 |
| CN | 102655210 A | 9/2012 |
| CN | 102683583 A | 9/2012 |
| CN | 103117359 A | 5/2013 |

\* cited by examiner

HIGHLY RELIABLE NONVOLATILE MEMORY AND MANUFACTURING METHOD THEREOF

FIELD OF THE INVENTION

The present invention relates to a resistive random access memory (RRAM), and in particular, relates to a highly reliable and highly uniform memory and a manufacturing method thereof, which is in a field of manufacturing a non-volatile memory and optimizing the performance of the non-volatile memory in a CMOS ultra-large-scale integrated circuit (ULSI).

BACKGROUND OF THE INVENTION

The semiconductors memory has been playing core role in the development of the semiconductor technology, holding an irreplaceable position in various information technology (IT) fields. Currently, the mainstream semiconductor memory includes a volatile dynamic random access memory (DRAM) and static random access memory (SRAM), and a nonvolatile flash memory (Flash). However, as the technology advances, that is, as the critical dimension continuously reduces and the integration degree constantly increases, the scaling of the DRAM, SRAM and Flash is reaching the limitation, especially in the circumstance of entering a nanometer technology node. In particular, the performance of the parameters of the nonvolatile memory fluctuates randomly and significantly, resulting in more and more severed reliability problems. Under such circumstances, through researches of a variety of technology solutions such as new materials, new structures and new functions, new technologies for the nonvolatile memory, including a charge trapping memory (CTM), a ferroelectric random access memory (FeRAM), a magnetic random access memory (MRAM), a phase change random access memory (PRAM) and a resistive random access memory (RRAM), have been suggested. Among them, the resistive random access memory has gained widespread attention due to its excellent performance in various aspects, and has become a research focus for the next generation mainstream memories.

The resistive random access memory stores information based on the resistive characteristic of the storage medium, which is a property for certain dielectric materials that the resistance changes reversibly between a high and a low resistance state under an externally-applied electrical field. Further, the resistive random access memory is classified into an inorganic resistive random access memory and an organic resistive random access memory based on different resistive material used therein. In the prior art, the inorganic resistive random access memory, which is fabricated based on transition metal oxide (TMO), is dominant due to the advantages such as simple processes and low costs. A structure of the TMO-RRAM is shown in FIG. 1. Two electrodes are applied with a voltage V. In an initial state, the resistive random access memory is in a high resistance state. When the voltage V is increased to a certain value, the resistive random access memory is changed from the high resistance state to a low resistance state. Such a process is referred to as a forming process, and the voltage V corresponding thereto is defined as Vform. The low resistance state may be maintained for a long period even if a voltage supply is cut off. And after the voltage is further increased to a certain value, the resistive random access memory returns to the high resistance state. Such a process is referred to as a resetting process, and the voltage V corresponding thereto is defined as Vreset. Similarly, the high resistance state may be maintained for a long period even if a voltage supply is cut off. And after the voltage is further increased to a certain value, the resistive random access memory returns to the low resistance state. Such a process is referred to as a setting process, and the voltage V corresponding thereto is defined as Vset.

Currently, a mainstream opinion is that the metal oxide based resistive random access memory has the resistive characteristic based on a conductive filament mechanism. That is, the high and the low resistance states correspond to a formation process and a rupture process of the conductive filament, respectively. When V=Vset, the electric field causes metal ions or oxygen vacancies to move directionally so that a conductive channel is formed in a local region to connect a top electrode with a bottom electrode, which corresponds to the low resistance state. On the other hand, when the voltage becomes Vreset, the channel is ruptured due to a combined effect of the electric filed and the heat, resulting in that the resistive random access memory becomes the high resistance state.

Because of the fact that the formation location, the length and the size of the conductive channel in the resistive random access memory are random, parameters exhibited by the resistive random access memories may fluctuate depending on various memories or various switching processes, and thus a uniformity problem of the memories is caused. During the repeated reading operations, the metal ions and the oxygen vacancies may diffuse into surroundings so that the performance of the resistive random access memory is deteriorated, which causes a reliability problem. The present invention is to provide a solution directing to the above two aspects.

SUMMARY OF THE INVENTION

Directed to the above-mentioned problems, an object of the present invention is to increase the uniformity of the resistive random access memory and solve the reliability problem existed in the resistive random access memory. According to the present invention, the uniformity and reliability of the resistive random access memory can be effectively increased by adopting a method in which a doping technology and a double-layer resistive material forming technology are combined.

A technical solution of the present invention is as follows.

A reliable nonvolatile memory comprising: top electrodes, bottom electrodes and a resistive material layer disposed therebetween, wherein the top electrodes are positioned on top in the memory; the bottom electrodes are positioned on a substrate; metal oxide for forming the resistive material layer is doped with metal; and a metal oxygen storage layer is further disposed between the top electrodes and the resistive material layer.

Further, metal M1 corresponding to the metal oxide of the resistive material layer and the doped metal M2 meet any one of the following conditions:
  Gibbs free energy $\Delta M1$ of the metal M1 reacting with oxygen to form an oxide is lower than Gibbs free energy $\Delta M2$ of the metal M2 reacting with oxygen to form an oxide; or
  a valence state of the metal M2 in its corresponding oxide is lower than a valence state of the metal M1 in its corresponding oxide.

Further, metal M3 corresponding to the metal oxygen storage layer meets the following condition:

Gibbs free energy ΔM1 of the metal M1 reacting with oxygen to form an oxide is higher than Gibbs free energy ΔM3 of the metal M3 reacting with oxygen to form an oxide.

Furthermore, the electrodes are patterned so as to form a structure of a series of parallel-arranged sawtooth bars on a surface of the substrate and a surface of the metal oxygen storage layer, and the sawtooth bars have a cross-section of '^' shape.

Alternatively, the substrate is formed of Si as a supporting substrate; the top and bottom electrodes are formed of conductive metal or metal nitride, which is selected from one or more of Pt, Al, Ti and TiN; and the resistive material layer is formed of transition metal oxide, which is selected form one or more of HfOx, TaOx, ZrOx and WOx.

Moreover, the present invention provides a method for manufacturing a highly reliable nonvolatile memory, comprising the following steps:

1) forming bottom electrodes by sputtering a metal layer on a substrate and then patterning the metal layer;
2) fabricating a resistive material layer formed of metal oxide to cover the bottom electrodes by using a sputtering process, and then doping metal impurities into the resistive material layer;
3) forming a thin metal oxygen storage layer on the resistive material layer by using a sputtering process or an evaporation process; and
4) forming top electrodes on the thin metal oxygen storage layer by using a patterning process and thus competing the manufacturing.

Alternatively, in the formation of the bottom electrodes, metal Ti and metal Pt are sputtered on the substrate to a thickness of 100-200 nm, and the bottom electrodes are formed by patterning through a stripping process, and wherein Ti is used as an adhesion layer, and Pt is used for the bottom electrodes.

Furthermore, metal M1 corresponding to the metal oxide of the resistive material layer and the doped metal M2 meet any one of the following conditions:

Gibbs free energy ΔM1 of the metal M1 reacting with oxygen to form an oxide is lower than Gibbs free energy ΔM2 of the metal M2 reacting with oxygen to form an oxide; or a valence state of the metal M2 in its corresponding oxide is lower than a valence state of the metal M1 in its corresponding oxide.

Alternatively, metal M3 corresponding to the metal oxygen storage layer meets the following condition:

Gibbs free energy ΔM1 of the metal M1 reacting with oxygen to form an oxide is higher than Gibbs free energy ΔM3 of the metal M3 reacting with oxygen to form an oxide.

Alternatively, the resistive material layer is formed by a PVD sputtering process to a thickness of 20-50 nm; metal impurities are doped into the resistive material layer by using an ion implantation process; and the thin metal oxygen storage layer is formed by using a PVD sputtering process to a thickness of 5-10 nm.

The resistive random access memory provided by the present invention has the following advantages.

(1) The fabrication process is compatible with a CMOS process and thus is easily to be implemented.

(2) The uniformity of the resistive random access memory can be effectively increased by the doping process. Both of the above-mentioned two conditions for the doped metal M2 can increase the concentration of oxygen vacancies surrounding M2 so that the conductive channel formed by the oxygen vacancies is formed along the doping path, and thus the poor uniformity problem caused by the random conductive filaments can be avoided. Specifically, as to the first condition that Gibbs free energy ΔM1 of the metal M1 reacting with oxygen to form an oxide is lower than Gibbs free energy ΔM2 of the metal M2 reacting with oxygen to form an oxide, that is, the metal M1 corresponding to the resistive material layer is more easily to be reacted with oxygen. In other words, the surrounding of M2 is of a higher concentration of oxygen vacancies. On the other hand, owing to the second condition that a valence state of the metal M2 in its corresponding oxide is lower than a valence state of the metal M1 in its corresponding oxide, the forming energy of the oxygen vacancies surrounding M2 is reduced, that is, the concentration of the oxygen vacancies surrounding M2 is higher.

(3) By introducing the thin metal oxygen storage layer between the resistive material layer and top electrodes, the reliability problems existed in the resistive random access memory is solved. Since Gibbs free energy ΔM1 of the metal M1 reacting with oxygen to form an oxide is higher than Gibbs free energy ΔM3 of the metal M3 reacting with oxygen to form an oxide, that is, the metal M3 is more easily to be reacted with oxygen, the directionally-moved oxygen ions are reacted with the metal M3 during the forming/setting process at an interface between the resistive material layer and the metal oxygen storage layer and is stored in a manner of oxide. Thus, the oxygen ions can be prevented from diffusing into the environment along the metal of the top electrodes and affecting the durability of the resistive random access memory.

BRIEF DESCRIPTION OF THE DRAWINGS

FIGS. 3-9 are schematic views showing a process for fabricating respective portions of a resistive random access memory in a manufacturing method thereof according to an embodiment of the present invention, in which:

FIG. 3 is a schematic view showing a process for fabricating an insulating layer for a substrate;

FIG. 4 is a schematic view showing a process for fabricating bottom electrodes by sputtering metal on the substrate;

FIG. 5 is a schematic view showing a process for fabricating a thin resistive material layer formed of metal oxide by using a sputtering method to cover the bottom electrodes;

FIG. 6 is a schematic view showing a process for doping metal impurities into the resistive material layer;

FIG. 7 is a schematic view showing a process for fabricating a thin metal oxygen storage layer on the resistive material layer by using a sputtering method or an evaporation method;

FIG. 8 is a schematic view showing a process for fabricating leading-out holes for the bottom electrodes by using an etching process; and FIG. 9 is a schematic view showing a process for fabricating top electrodes of the resistive random access memory.

DETAILED DESCRIPTION OF THE EMBODIMENTS

Hereinafter, technical solutions of embodiments of the present invention will be clearly and fully described in conjunction with the accompanying drawings. However, it is understood that the described embodiments are only part of the implementations of the present invention, rather than all of them. Based on the embodiments of the present invention, other implementations made by those skilled in the art without paying creative efforts will fall into the protection scope of the present invention.

Figure 1:
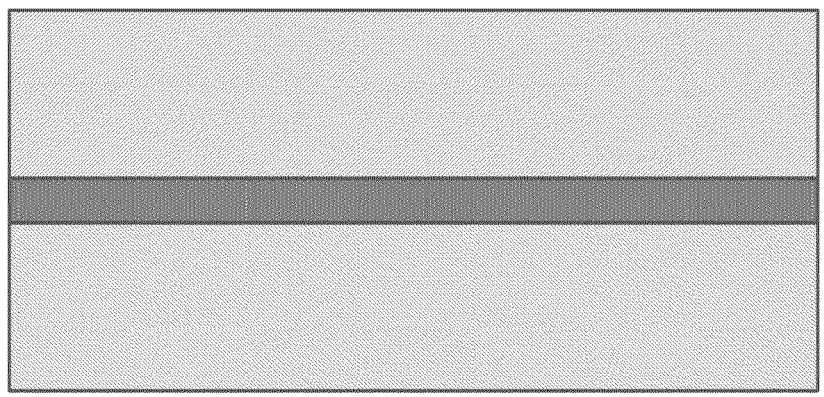
FIG. 1 is a schematic view showing the transition metal oxide based resistive random access memory in the prior art.
Figure 2:
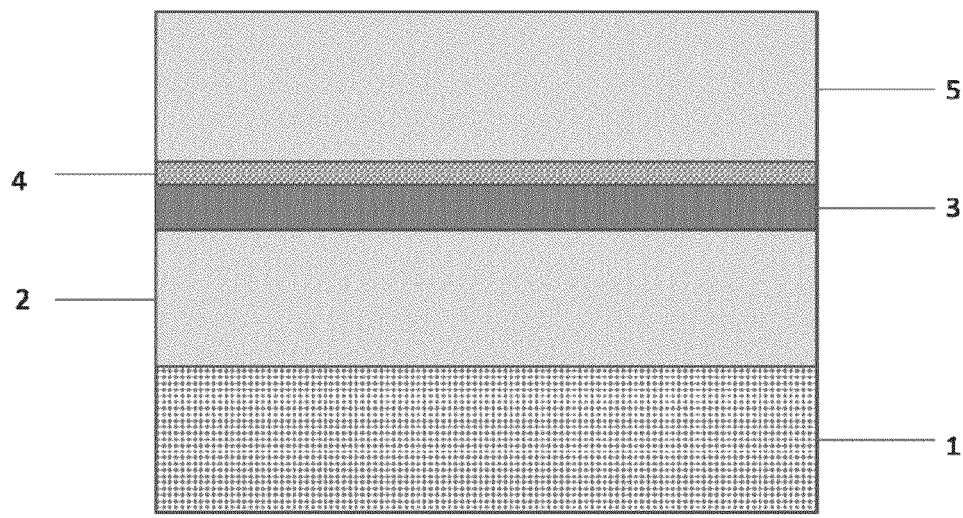
FIG. 2 is a schematic view showing a resistive random access memory according to an embodiment of the present invention, in which 1 denotes a substrate; 2 denotes a bottom electrode; 3 denotes a resistive material layer doped with metal; 4 denotes a thin metal oxygen storage layer; and 5 denotes a top electrode.

FIG. 2 shows a structure of a highly reliable nonvolatile memory, which includes, from the bottom up a substrate 1, a bottom electrode 2, a resistive material layer 3 doped with metal, a thin metal oxygen storage layer 4 and a top electrode 5.

The shown structure is described in details as follows.

(1) The substrate 1 is formed of Si or other supporting substrates.

(2) The bottom electrode 2 and the top electrode 5 (defined as M01 and M0$_2$, respectively) are formed of conductive metal or metal nitride, such as Pt, Al, Ti and TiN.

(3) The resistive material layer 3 is formed of, preferably, the mainstream transition metal oxide (such as HfOx, TaOx, ZrOx and WOx).

(4) The metal doped into the resistive material layer 3 meets one of the following basic conditions (the metal corresponding to the metal oxide is defined as M1, and the doped metal is defined as M2): (1) Gibbs free energy ΔM1 of M1 reacting with oxygen to form an oxide is lower than Gibbs free energy ΔM2 of M2 reacting with oxygen to form an oxide; (2) a valence state of M2 in its corresponding oxide is lower than a valence state of M1 in its corresponding oxide.

(5) The metal oxygen storage layer 4 meets the following condition (the metal corresponding to the metal oxygen storage layer 4 is defined as M3): Gibbs free energy ΔM1 of M1 reacting with oxygen to form an oxide is higher than Gibbs free energy ΔM3 of M3 reacting with oxygen to form an oxide.

FIGS. 3-9 are schematic views showing a process for manufacturing a highly reliable nonvolatile resistive random access memory according to the present invention.

The process for manufacturing the resistive random access memory according to the present invention is described as follows.

(1) A bottom electrode layer is fabricated by sputtering metal Ti/M0$_2$ on a substrate, where Ti is used as an adhesion layer, and M0$_2$ is used for the bottom electrode. Bottom electrodes are formed by patterning through a stripping process or a corrosion process.

(2) A thin resistive material layer is fabricated by using a sputtering process.

(3) The resistive material layer is doped with corresponding metal impurities through an ion implantation process.

(4) A thin metal oxygen storage layer is fabricated by using a sputtering process or an evaporation process.

(5) A top electrode layer is fabricated by using a sputtering process and then is patterned to form top electrodes. A size of the resistive random access memory is defined.

The present invention will be further described in more details with respect to the accompany drawings through a specific embodiment.

The process for manufacturing the highly reliable and highly uniform resistive random access memory according to the present invention will be described as follows with reference to the accompany drawings.

Figure 3:
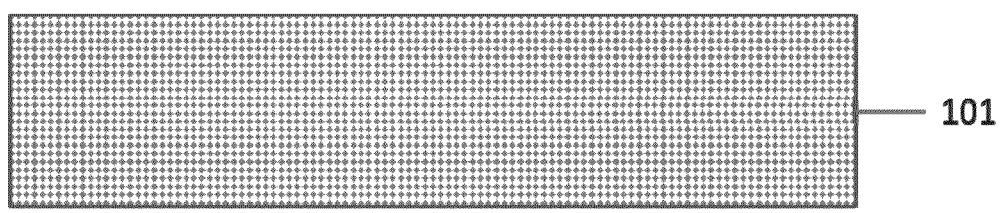

(1) An insulating layer is fabricated. As shown in FIG. 3, SiO$_2$ is grown on a silicon substrate as the insulating layer 101.

Figure 4:
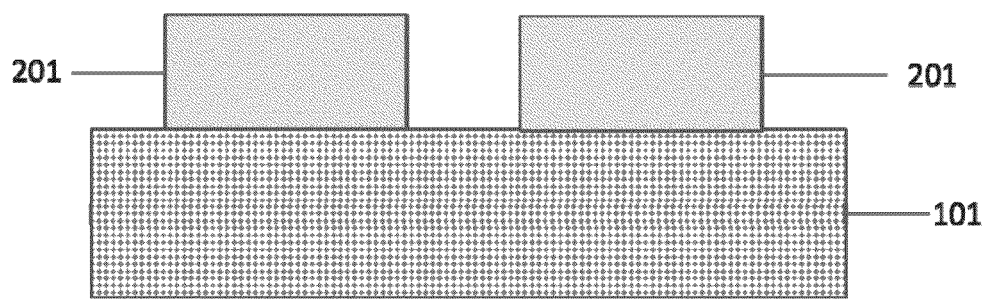

(2) Bottom electrodes are fabricated. Metal Ti/Pt (with a thickness of about 100-200 nm) is sputtered on the substrate 101, where Ti is used as an adhesion layer, and Pt are used for the bottom electrodes. The bottom electrodes 201 are formed by patterning through a stripping process. The bottom electrodes 201 are formed on the insulating layer, that is on the substrate, in a structure of a series of parallel-arranged sawtooth bars, as shown in FIG. 4.

Figure 5:
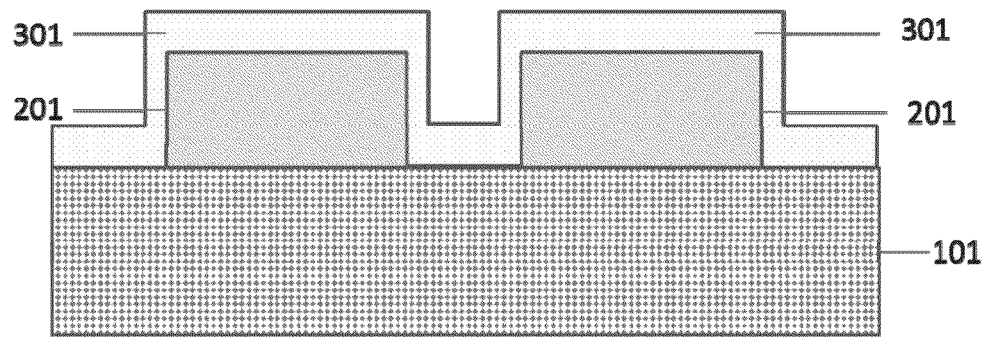

(3) A resistive material layer is fabricated. The resistive material layer 301 (with a thickness of about 20-50 nm) formed of TaOx is fabricated through a PVD sputtering process. The resistive material layer 301 covers the structure of the sawtooth bars of the bottom electrodes, as shown in FIG. 5.

Figure 6:
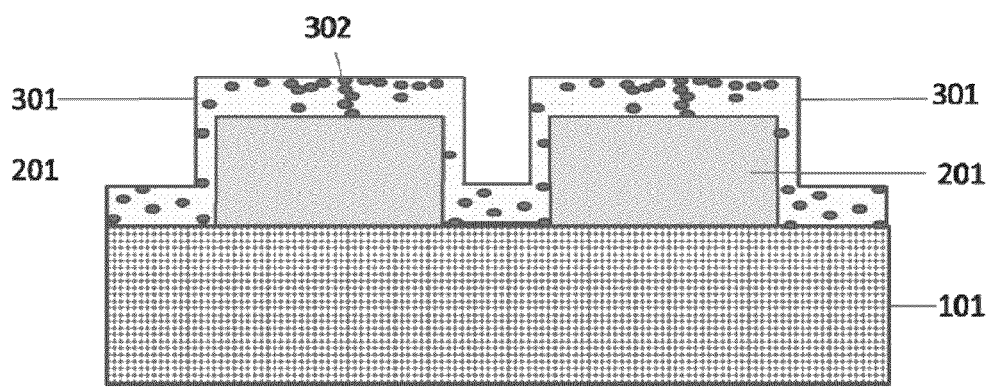

(4) The resistive material layer is doped. The thin TaOx layer is implanted with metal Al impurities 302 by using an ion implantation process, as shown in FIG. 6. The metal M1 corresponding to the metal oxide of the resistive material layer and the doped metal M2 meets any one of the following conditions:

Gibbs free energy ΔM1 of M1 reacting with oxygen to form an oxide is lower than Gibbs free energy ΔM2 of M2 reacting with oxygen to form an oxide; or a valence state of M2 in its corresponding oxide is lower than a valence state of M1 in its corresponding oxide.

Figure 7:
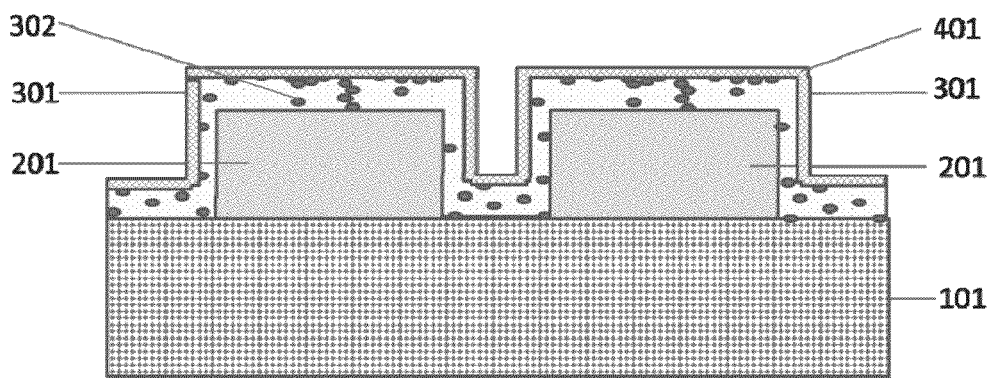

(5) A thin metal oxygen storage layer is fabricated. The thin metal oxygen storage layer 401 formed of Ti (with a thickness of about 5-10 nm) is sputtered by using a PVD sputtering process. The metal oxygen storage layer 401 covers the resistive material layer 301, as shown in FIG. 7.

Figure 8:
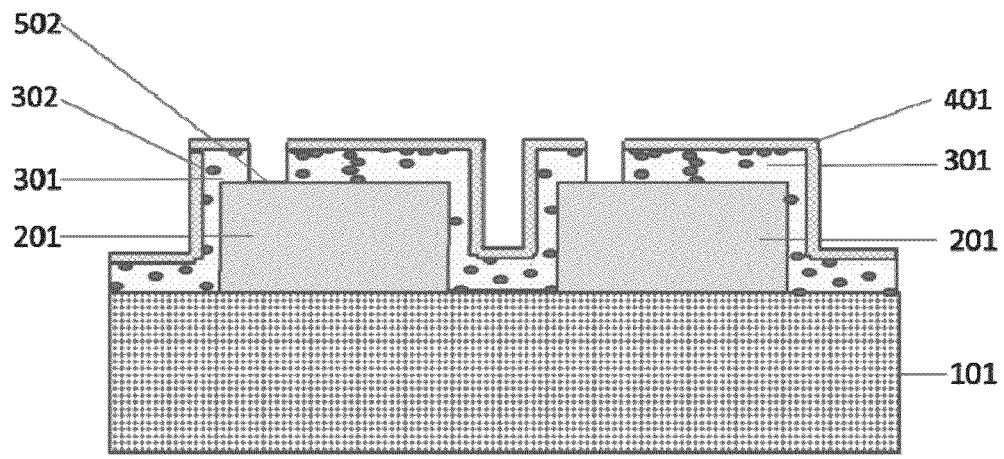
Figure 9:
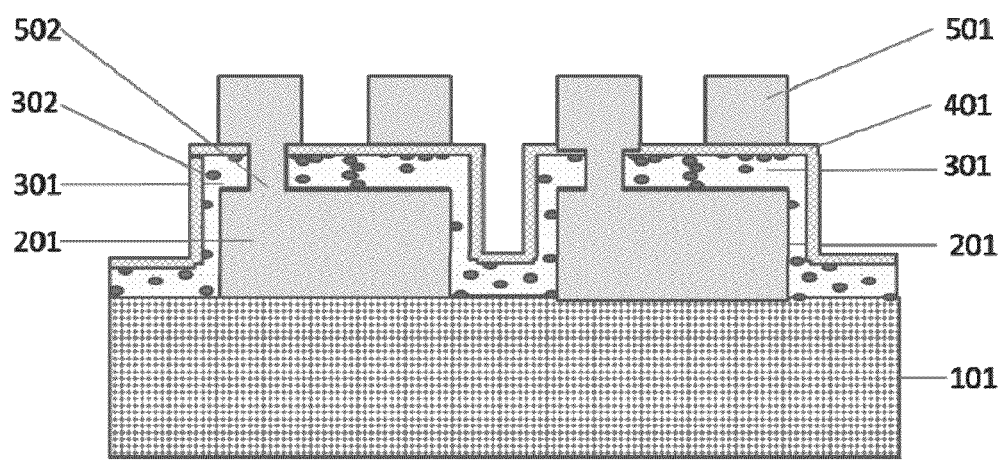

(6) Leading-out holes 502 for the bottom electrodes are formed by using an etching process, as shown in FIG. 8. Top electrodes 501 are fabricated by using a PVD sputtering process and a patterning process. A voltage may be applied to the top electrodes and the bottom electrodes. A size of the device is defined (2 μm×2 μm-100 μm×100 μm). As shown in FIG. 9, the bottom electrodes are disposed on the substrate. The metal oxide of the resistive material layer is doped with metal. The metal oxygen storage layer is further disposed between the top electrodes and the resistive material layer.

(7) The highly reliable and highly uniform resistive random access memory is manufactured.

The method according to the present invention combines a doping method and a double-layer forming method. By selectively choosing the resistive material layer, the material for doping and the material for the interlayer layer that meet certain conditions, and by adopting proper processes, the highly reliable and highly uniform resistive random access memory can be fabricated, and accordingly the performance of the resistive random access memory can be increased.

What is claimed is:
1. A nonvolatile memory comprising:
a substrate;
top electrodes positioned on top in the memory:
bottom electrodes positioned on the substrate;
a resistive material layer disposed between the top electrodes and the bottom electrodes and comprising a metal oxide (M1) doped with a metal (M2);
a metal layer (M3) for oxygen storage disposed between the top electrodes and the resistive material layer,
wherein M1 and M2 meet any one of the following conditions:
Gibbs free energy ΔM1 of M1 reacting with oxygen to form an oxide is lower than Gibbs free energy ΔM2 of M2 reacting with oxygen to form an oxide, or
a valence state of M2 in its corresponding oxide is lower than a valence state of M1 in its corresponding oxide; and wherein M3 meets the following condition:
Gibbs free energy ΔM1 of M1 reacting with oxygen to form an oxide is higher than Gibbs free energy ΔM3 of M3 reacting with oxygen to form an oxide.

2. The nonvolatile memory of claim 1, wherein the electrodes are patterned so as to form a structure of a series of parallel-arranged sawtooth bars on a surface of the substrate and a surface of the metal layer for oxygen storage, the sawtooth bars having a cross-section of '^' shape.

3. The nonvolatile memory of claim 1, wherein the substrate is formed of Si as a supporting substrate; the top and bottom electrodes are formed of conductive metal or metal nitride, which is selected from one or more of Pt, Al, Ti and TiN; and the resistive material layer is formed of transition metal oxide, which is selected from one or more of HfOx, TaOx, ZrOx and WOx.

4. A method for manufacturing a nonvolatile memory, the method comprising the following steps:
1) forming bottom electrodes by sputtering a metal layer on a substrate and then patterning the metal layer;
2) fabricating a resistive material layer formed of a metal oxide (M1) to cover the bottom electrodes by using a sputtering process, and then doping a metal (M2) into the resistive material layer;
3) forming a thin metal layer (M3) for oxygen storage on the resistive material layer by using a sputtering process or an evaporation process; and
4) forming top electrodes on the thin metal layer (M3) for oxygen storage by using a patterning process and thus completing the manufacturing,
wherein M1 and M2 meet any one of the following conditions:
Gibbs free energy ΔM1 of M1 reacting with oxygen to form an oxide is lower than Gibbs free energy ΔM2 of M2 reacting with oxygen to form an oxide, or
a valence state of M2 in its corresponding oxide is lower than a valence state of M1 in its corresponding oxide; and
wherein M3 meets the following condition:
Gibbs free energy ΔM1 of M1 reacting with oxygen to form an oxide is higher than Gibbs free energy ΔM3 of M3 reacting with oxygen to form an oxide.

5. The method for manufacturing the nonvolatile memory of claim 4, wherein in the formation of the bottom electrodes, metal Ti and metal Pt are sputtered on the substrate to a thickness of 100-200 nm, and the bottom electrodes are formed by patterning through a stripping process, and wherein Ti is used as an adhesion layer, and Pt is used for the bottom electrodes.

6. The method for manufacturing the nonvolatile memory of claim 4, wherein the resistive material layer is formed by a PVD sputtering process to a thickness of 20-50 nm; the metal (M2) is doped into the resistive material layer by using an ion implantation process; and the thin metal layer (M3) for oxygen storage is formed by using a PVD sputtering process to a thickness of 5-10 nm.

7. The nonvolatile memory of claim 1, wherein the metal (M2) comprises Al.

8. The nonvolatile memory of claim 1, wherein the metal oxide (M1) comprises TaOx and the metal (M2) comprises Al.

9. The nonvolatile memory of claim 1, wherein the metal oxide (M1) comprises TaOx and the metal layer (M3) comprises Ti.

10. The nonvolatile memory of claim 1, wherein the metal oxide (M1) comprises TaOx, the metal (M2) comprises Al and the metal layer (M3) comprises Ti.

11. The nonvolatile memory of claim 1, wherein Gibbs free energy ΔM1 of M1 reacting with oxygen to form an oxide is lower than Gibbs free energy ΔM2 of M2 reacting with oxygen to form an oxide.

12. The nonvolatile memory of claim 1, wherein a valence state of M2 in its corresponding oxide is lower than a valence state of M1 in its corresponding oxide.

13. The method for manufacturing the nonvolatile memory of claim 4, wherein Gibbs free energy ΔM1 of M1 reacting with oxygen to form an oxide is lower than Gibbs free energy ΔM2 of M2 reacting with oxygen to form an oxide.

14. The method for manufacturing the nonvolatile memory of claim 4, wherein a valence state of M2 in its corresponding oxide is lower than a valence state of M1 in its corresponding oxide.

* * * * *